(12) United States Patent
Cho et al.

(10) Patent No.: US 8,617,792 B2
(45) Date of Patent: Dec. 31, 2013

(54) AROMATIC RING-CONTAINING POLYMER FOR RESIST UNDERLAYER, RESIST UNDERLAYER COMPOSITION INCLUDING THE SAME, AND METHOD OF PATTERNING DEVICE USING THE SAME

(75) Inventors: Sung-Wook Cho, Uiwang-si (KR);
Kyong-Ho Yoon, Uiwang-si (KR);
Min-Soo Kim, Uiwang-si (KR);
Seung-Bae Oh, Uiwang-si (KR);
Jee-Yun Song, Uiwang-si (KR);
Hwan-Sung Cheon, Uiwang-si (KR)

(73) Assignee: Cheil Industries, Inc., Gumi-si, Kyeongsangbuk-do (KR)

(*) Notice: Subject to any disclaimer, the term of this patent is extended or adjusted under 35 U.S.C. 154(b) by 373 days.

(21) Appl. No.: 12/848,459

(22) Filed: Aug. 2, 2010

(65) Prior Publication Data
US 2011/0027722 A1 Feb. 3, 2011

(30) Foreign Application Priority Data
Jul. 31, 2009 (KR) .................. 10-2009-0070937
Jul. 30, 2010 (KR) .................. 10-2010-0074307

(51) Int. Cl.
*G03F 7/00* (2006.01)
*G03F 7/075* (2006.01)
*C08G 77/00* (2006.01)
*C08G 77/04* (2006.01)
*C08G 77/18* (2006.01)
*C08L 83/00* (2006.01)
*C08L 83/06* (2006.01)

(52) U.S. Cl.
USPC ............ 430/271.1; 528/10; 528/40; 524/588; 430/270.1; 430/323; 556/400; 556/465; 556/470; 556/482; 556/486; 556/489; 564/379

(58) Field of Classification Search
USPC .................. 556/486, 482; 528/40
See application file for complete search history.

(56) References Cited

U.S. PATENT DOCUMENTS

| | | | |
|---|---|---|---|
| 5,916,938 A * | 6/1999 | Brunnemann et al. | ........ 524/128 |
| 7,060,761 B2 | 6/2006 | Arai et al. | |
| 7,303,855 B2 | 12/2007 | Hatakeyama et al. | |
| 7,358,025 B2 | 4/2008 | Hatakeyama | |
| 2002/0055550 A1 * | 5/2002 | Kato et al. | ..................... 522/134 |
| 2007/0148586 A1 | 6/2007 | Uh et al. | |
| 2008/0318158 A1 | 12/2008 | Takei et al. | |

FOREIGN PATENT DOCUMENTS

| | | |
|---|---|---|
| JP | 2004-075769 A | 3/2004 |
| JP | 2008-020842 A | 1/2008 |
| JP | 2008-239955 A | 10/2008 |
| JP | 2008-239956 A | 10/2008 |
| KR | 10-2005-0033443 A | 4/2005 |
| KR | 10-2006-0099446 A | 9/2006 |
| KR | 10-0725793 B1 | 6/2007 |
| KR | 10-0760522 B1 | 10/2007 |
| KR | 10 2008-0014055 A | 2/2008 |
| TW | 200825626 | 6/2008 |

OTHER PUBLICATIONS

Hayashi et al., Synthesis and Properties of Polysiloxanes Possessing 9,9-Diarylfluorene Structure in the Main Chain, Feb. 12, 2009, Polymer Journal, vol. 41 Issue 4 pp. 272-278.*

Saegusa et al., Preparation and Characterization of Novel Polyaryloxydiphenylsilanes with High Glass Transition Temperature by Melt Polycondensation of Dianilinodiphenylsilane with Bisphenols, Mar. 10, 2003, Journal of Polymer Science A: Polymer Chemistry, vol. 30, 1401-1406.*

* cited by examiner

*Primary Examiner* — Cynthia H Kelly
*Assistant Examiner* — Anna Conlin
(74) *Attorney, Agent, or Firm* — Lee & Morse, P.C.

(57) ABSTRACT

An aromatic ring-containing polymer for a resist underlayer, the polymer including a unit represented by the following Chemical Formula 1:

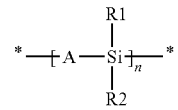

[Chemical Formula 1]

wherein,
R1 and R2 are independently hydrogen, a C1 to C10 alkyl group, or an aromatic group,
A is a functional group derived from an aromatic compound with a heteroatom or without a heteroatom, and
n is an integer of one or more.

14 Claims, No Drawings

AROMATIC RING-CONTAINING POLYMER FOR RESIST UNDERLAYER, RESIST UNDERLAYER COMPOSITION INCLUDING THE SAME, AND METHOD OF PATTERNING DEVICE USING THE SAME

BACKGROUND

1. Field

Embodiments relate to an aromatic ring-containing polymer for a resist underlayer, a resist underlayer composition including same, and a method of patterning a device using the same.

2. Description of the Related Art

There is a continuous demand for reducing the size of structural shapes in the microelectronics industry and other related industries, including the manufacture of microscopic structures (e.g., micromachines and magneto-resist heads). In the microelectronics industry, there is a need for reducing the size of microelectronic devices in order to provide a number of circuits in a given chip size. Effective lithographic techniques are essential to achieve a reduction in the size of structural shapes.

A typical lithographic process involves the following processes. First, a resist is coated on an underlying material, and it is subjected to exposure to irradiation to form a resist layer. Thereafter, the resist layer is subjected to development using a developing solution to provide a patterned resist layer, and the underlying material exposed by the patterned resist layer is etched to transfer a pattern into the underlying material. After completion of the transfer, remaining portions of the resist layer are removed.

However, the resist may not provide resistance to the etching step to an extent that is sufficient to effectively transfer the desired pattern to an underlying material. In the case where an extremely thin resist layer is required, an underlying material to be etched is thick, a large etching depth is needed, or the use of a particular etchant is required depending on the type of underlying material, a resist underlayer may be used.

The resist underlayer acts as an intermediate layer (between the resist layer and the underlying material) that can be patterned by transfer from the patterned resist. The resist underlayer should be able to receive the pattern from the patterned resist layer and withstand etching required to transfer the pattern to the underlying material.

Many materials for such an underlayer have been suggested, but there is a need for improved underlayer compositions. Since conventional underlayer materials are difficult to apply to substrates, the use of chemical and physical vapor deposition, special solvents, and/or high-temperature baking may be required. However, these methods have a high cost.

Thus, an underlayer composition that can be applied by spin-coating techniques without high temperature baking has been recently researched. An underlayer that can be selectively etched using an overlying resist layer as a mask in an easy manner, while being resistant to etching necessary to pattern an underlying metal layer using the underlayer as a mask, also needs to be researched.

An underlayer composition that provides desirable storage life-span properties and avoids unwanted interactions (e.g., resist or substrate pollution caused by acid catalyst in the underlayer composition a hard mask) with an imaging resist layer also needs to be researched. An underlayer composition that has predetermined optical properties against imaging irradiation of short wavelengths (e.g., 157 nm, 193 nm, and 248 nm) also needs to be researched.

In summary, an antireflective underlayer having high etching selectivity and sufficient resistance against multiple etching, as well as minimized reflectivity between a resist and underlying material, is needed for lithography in order to enable production of a very fine semiconductor device.

SUMMARY

It is a feature of an embodiment to provide an aromatic ring-containing polymer for a resist underlayer that may be coated using a spin-on application technique.

It is another feature of an embodiment to provide an aromatic ring-containing polymer for a resist underlayer exhibiting excellent optical properties, mechanical characteristics, and etching selectivity characteristics.

It is another feature of an embodiment to provide a resist underlayer composition that does not have contamination problems by an acid catalyst.

It is another feature of an embodiment to provide a method of patterning a device using the resist underlayer composition.

At least one of the above and other features and advantages may be realized by providing an aromatic ring-containing polymer for a resist underlayer, the polymer including a unit represented by the following Chemical Formula 1:

[Chemical Formula 1]

$$*-\left[A-\underset{R2}{\overset{R1}{\underset{|}{Si}}}\right]_n-*$$

wherein,

R1 and R2 are independently hydrogen, a C1 to C10 alkyl group, or an aromatic group, A is a functional group derived from an aromatic compound with a heteroatom or without a heteroatom, and n is an integer of one or more.

n may be an integer of 1 to 100.

A may be a functional group derived from an aromatic compound represented by the following Chemical Formula 1a:

[Chemical Formula 1a]

wherein,

R3 and R4 are independently hydrogen, a hydroxyl group, a C1-C4 lower alkyl group, or an alkoxy group, R5 and R6 are independently hydrogen, a hydroxyl group, a C1-C4 lower alkyl group, or an alkoxy group, and X is O (oxygen) or S (sulfur).

A may be a functional group derived from an aromatic compound represented by the following Chemical Formula 1b:

[Chemical Formula 1b]

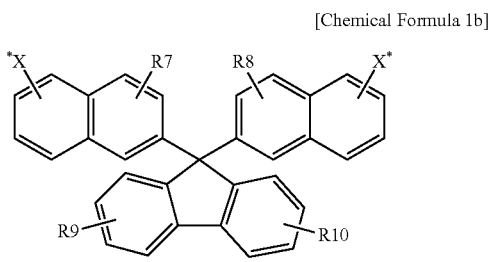

wherein,

R7 and R8 are independently hydrogen, a hydroxy group, an alkoxy group, or a C1-C4 lower alkyl group, R9 and R10 are independently hydrogen, a hydroxy group, a C1-C4 lower alkyl group, or an alkoxy group, and X is O (oxygen) or S (sulfur).

The aromatic group may include a C5 to C20 aromatic group.

The heteroatom may be N, O, S, or P.

The polymer may have a weight average molecular weight of about 2,000 to about 20,000.

The alkoxy group may be a C1-C10 alkoxy group.

At least one of the above and other features and advantages may also be realized by providing a resist underlayer composition, including (a) an aromatic ring-containing polymer including a unit represented by the following Chemical Formula 1; and (b) an organic solvent,

[Chemical Formula 1]

wherein,

R1 and R2 are independently hydrogen, a C1 to C10 alkyl group, or an aromatic group, A is a functional group derived from an aromatic compound with a heteroatom or without a heteroatom, and n is an integer of one or more.

The aromatic ring-containing polymer (a) may be included in an amount of about 1 to about 20 wt %, and the organic solvent (b) may be included in an amount of about 80 to about 99 wt %.

The resist underlayer composition may further include a surfactant.

The resist underlayer composition may further include a cross-linking component.

At least one of the above and other features and advantages may also be realized by providing a method for patterning a device, the method including (a) providing a material layer on a substrate; (b) forming a resist underlayer using the resist underlayer composition according to an embodiment on the material layer; (c) forming a resist layer on the resist underlayer; (d) exposing the resist layer on the substrate; (e) developing the exposed substrate; and (f) etching the developed substrate.

The method may further include forming a silicon-containing resist underlayer prior to (c) of forming the resist layer.

The method may further include forming a bottom antireflective coating (BARC) on the silicon-containing resist underlayer prior to (c) of forming the resist layer.

The method may be a method of manufacturing a semiconductor integrated circuit device.

DETAILED DESCRIPTION

Korean Patent Application No. 10-2009-0070937, filed on Jul. 31, 2009, and Korean Patent Application No. 10-2010-0074307, filed on Jul. 30, 2010, in the Korean Intellectual Property Office, and entitled: "Aromatic Ring-containing Polymer for Underlayer of Resist, Underlayer Composition of Resist Including Same, and Method of Patterning Device Using Same," are incorporated by reference herein in their entirety.

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

According to an embodiment, an aromatic ring-containing polymer including a unit represented by the following Chemical Formula 1 is provided. The aromatic ring-containing polymer including a unit represented by the following Chemical Formula 1 includes an aromatic ring having strong absorption at a short wavelength region (particularly, 193 nm, 248 nm, and so on) in a polymer backbone, and therefore may be used as an anti-reflection coating.

[Chemical Formula 1]

In above Chemical Formula 1,

R1 and R2 may be independently hydrogen, a C1 to C10 alkyl group, or an aromatic group, A may be a functional group derived from an aromatic compound. The aromatic compound may include a heteroatom or may not include a heteroatom, and n may be an integer of 1 or more. n may be an integer of 1 to 100.

The aromatic group may be a C5 to C20 aromatic group, and also may be a C6 to C20 aromatic group.

The heteroatom may be N, O, S, or P.

The functional group derived from an aromatic compound with a heteroatom or without a heteroatom (A) may be a functional group derived from a C6 to C40 aromatic compound. A may be a functional group derived from the aromatic compound represented by the following Chemical Formula 1a or 1b. In the following Chemical Formulae 1a and 1b, * indicates a site that is bound with Si of the above Chemical Formula 1 or a terminal site.

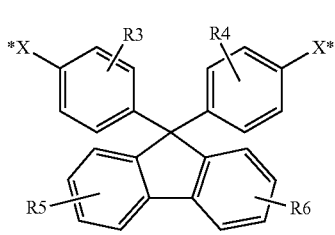

[Chemical Formula 1a]

In above Chemical Formula 1a,

R3 and R4 may be independently hydrogen, a hydroxyl group, an alkoxy group, such as a C1-C10 alkoxy group, or a C1-C4 lower alkyl group, R5 and R6 may be independently hydrogen, an alkoxy group, a C1-C4 lower alkyl group, or a hydroxyl group, and X may be O (oxygen) or S (sulfur). In one embodiment, X may be O.

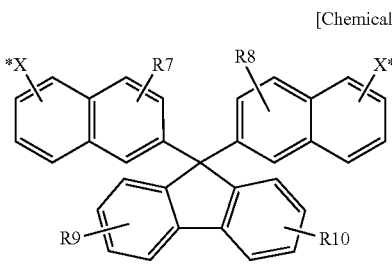

[Chemical Formula 1b]

In Chemical Formula 1b,

R7 and R8 may be independently hydrogen, an alkoxy group, such as a C1-C10 alkoxy group, a hydroxyl group, or a C1-C4 lower alkyl group, R9 and R10 may be independently hydrogen, an alkoxy group, such as a C1-C10 alkoxy group, a C1-C4 lower alkyl group, or a hydroxy group, and X may be O (oxygen) or S (sulfur).

Examples of the aromatic compound include 9,9'-bisphenolfluorene, 9,9-bis(1-naphthol)fluorene, dihydroxy benzene, dihydroxy naphthalene, dihydroxy pyrene, dihydroxy anthracene, or a combination thereof, but are not limited thereto.

The aromatic ring-containing polymer may have a weight average molecular weight of about 2,000 to about 20,000. When the aromatic ring-containing polymer has a weight average molecular weight of about 2,000 to about 20,000, a desirable coating thickness or thin film may be obtained.

A resist underlayer using the aromatic-containing polymer according to one embodiment may be an absorbance of 0.30 to 0.70. The resist underlayer with the absorbance may sufficiently act as the bottom anti-refractive coating layer.

The aromatic-containing polymer according to one embodiment may be prepared by reacting a aromatic compound from which A being a functional group may be derived, with a dichlorosilane compound represented by the following Chemical formula 5, and a weak base, in a solvent. The preparation is one embodiment and is not limited to the present invention.

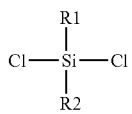

[Chemical Formula 5]

In the above Chemical Formula 5, R1 and R2 have the meanings given above.

The Examples of the aromatic compound include 9,9'-bisphenolfluorene, 9,9-bis(1-naphthol)fluorene, dihydroxy benzene, dihydroxy naphthalene, dihydroxy pyrene, dihydroxy anthracene, or a combination thereof, but are not limited thereto.

The explanary example of the aromatic compound represented by the following Chemical Formula 1a', or Chemical Formula 1b':

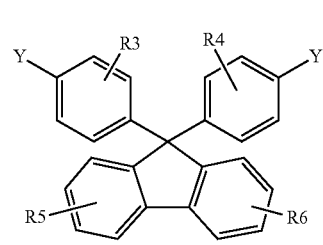

[Chemical Formula 1a']

In the Chemical Formula 1a', R3 to R6 have the meanings given above, and Y is —OH or —SH.

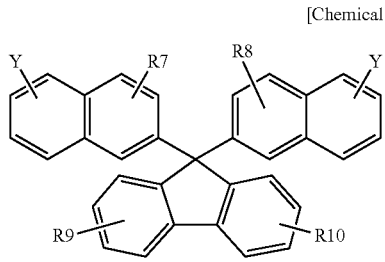

[Chemical Formula 1b']

In the Chemical Formula 1b', R7 to R10 have the meanings given above, and Y is —OH or —SH.

The weak base may be include triethylamine, aniline, pyridine, aluminum hydroxide, etc, but is not limited thereto.

The solvent may be any organic solvent, and any one, so long as it may be dissolved the aromatic compound, dichlorosilane compound, and the weak base. Example of the solvent includes toluene, xylene, etc, but is not limited thereto.

The reaction may be performed at a temperature of −20 to 100° C. for 5 to 15. The mixing ratio of the aromatic compound and the dichlorosilane compound may be suitably controlled. Furthermore, reaction conditions such as temperature may be suitably controlled.

A resist underlayer composition according to another embodiment includes (a) an aromatic ring-containing polymer and (b) an organic solvent.

As for the organic solvent, any organic solvent having sufficient solubility for the polymer may be used. Examples of the organic solvent may include propylene glycol monomethylether acetate (PGMEA), propylene glycol monomethylether (PGME), cyclohexanone, ethyl lactate, γ-butyrolactone (GBL), acetyl acetone, and the like.

In the resist underlayer composition according to an embodiment, the aromatic ring-containing polymer may be included in an amount of about 1 to about 20 wt %, and in another embodiment, about 3 to about 10 wt %. When the aromatic ring-containing polymer is included within the above amount, a desirable coating thickness of a resist underlayer may be appropriately adjusted.

The organic solvent may be used at a balance amount, e.g., about 80 to about 99 wt %. When the organic solvent is included within the above amount, a desirable coating thickness of a resist underlayer may be appropriately adjusted.

The resist underlayer composition according to an embodiment may further include a surfactant and/or a cross-linking component. Also, the resist underlayer composition according to an embodiment may further include an acid catalyst.

The content of the surfactant may be about 0.01 to about 1 parts by weight, based on 100 parts by weight of the resist underlayer composition. The content of the cross-linking component may be about 0.01 to about 1 part by weight, based on 100 parts by weight of the resist underlayer composition. The content of the acid catalyst may be about 0.01 to about 1 parts by weight, based on 100 parts by weight of the resist underlayer composition.

When the content of the cross-linking component falls in the above range, an appropriate cross-linking characteristic may be acquired while avoiding changes to the optical characteristic of the formed underlayer.

As for the surfactant, an alkylbenzene sulfonic acid salt, an alkylpyridinium salt, polyethylene glycol, or a quaternary ammonium salt may be used, but the present embodiment is not limited thereto.

The cross-linking component may include cross-linking agents that may react with a hydroxy group of a polymer composition by being catalyzed by a generated acid. The cross-linking component may include a melamine resin, an amino resin, a glycoluril compound, a bisepoxy compound, or a combination thereof.

Examples of suitable crosslinking components include etherified amino resins, methylated melamine resins (e.g., N-methoxymethyl-melamine resins), butylated melamine resins (e.g., N-butoxymethyl-melamine resins), methylated or butylated urea resins (e.g., Cymel U-65 Resin and UFR 80 Resin), glycoluril derivatives (e.g., Powderlink 1174) represented by the following Chemical Formula 30, and 2,6-bis(hydroxymethyl)-p-cresol. Bisepoxy-based compounds represented by the following Chemical Formula 31 and melamine-based compounds represented by the following Chemical Formula 32 may also be used as a cross-linking component.

[Chemical Formula 30]

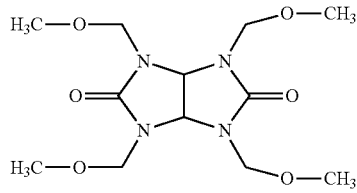

[Chemical Formula 31]

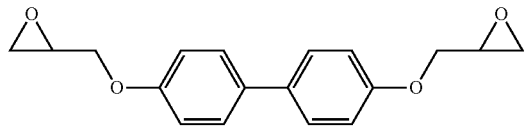

[Chemical Formula 32]

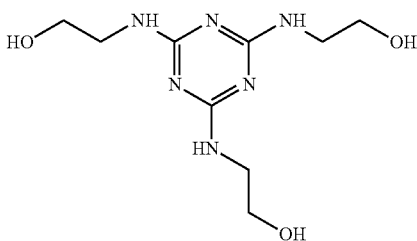

Examples of the acid catalyst may include an organic acid such as p-toluene sulfonic acid monohydrate, and a thermal acid generator (TAG)-based compound that has high storage stability. The thermal acid generator is an acid generating compound that produces acid during a heat treatment. Examples of the thermal acid generator include pyridinium p-toluene sulfonate, 2,4,4,6-tetrabromocyclohexadienone, benzoin tosylate, 2-nitrobenzyltosylate, and alkylesters of organic sulfonic acids. Also, other photosensitive acid catalysts compatible with other components of the antireflective composition that are widely known in the resist technology area may be used.

According to another embodiment, a method for patterning a device is provided. The method may include: (a) providing a material layer on a substrate; (b) forming a resist underlayer using the resist underlayer composition on the material layer; (c) forming a resist layer on the resist underlayer; (d) exposing the resist layer on the substrate; (e) developing the exposed substrate; and (f) etching the developed substrate.

Hereinafter, an example method of patterning is described in detail.

First, a material layer may be provided on a substrate.

The substrate may be, e.g., a silicon substrate (e.g., a wafer), and the material layer may be made of, e.g., a material of a conductive, semi-conductive, magnetic, or insulating material such as aluminum, silicon nitride (SiN), and the like. The material layer may be provided using a suitable technique known in the art, and therefore a detailed description thereof is not provided.

Thereafter, a resist underlayer may be provided using a resist underlayer composition according to an embodiment. The resist underlayer composition may be applied at a thickness of, e.g., 500 to 4,000 Å, followed by baking to provide the resist underlayer. The application process may be performed using a spin coating process, and the baking process may be performed at, e.g., 100 to 500° C. for 10 seconds to 10 minutes. The application technique, the thickness, the baking temperature, and the baking time of the resist underlayer are not limited to the above, and the resist underlayer may be formed according to various application techniques, thicknesses, baking temperatures, and baking times as determined by a person skilled in this art.

A resist layer (an irradiation-sensitive imaging layer) may be provided on the resist underlayer. The resist layer may be formed through a generally known process of applying the photosensitive resist composition and performing a baking process. Thus, further description thereof will not be provided.

Before the resist layer is formed, the process of forming the silicon-containing resist underlayer or the bottom anti-refractive coating layer may be further performed, or the two process are both further performed, in which a bottom anti-refractive coating layer may be formed after the silicon-containing resist underlayer is formed Since the formation of the silicon-containing resist underlayer and the formation of the antireflective coating layer are widely known to those skilled in the art, further description thereof will not be provided.

Subsequently, the resist layer may be exposed. For the exposure process, diverse exposure light sources may be used, such as ArF, KrF, extreme ultraviolet rays (EUV), or an E-beam. When the exposure is completed, a baking process may be performed to induce a chemical reaction in the exposed region. The baking process may be performed at a temperature ranging from about 90 to about 120° C. for about 60 to about 90 seconds.

Subsequently, a development process may be performed. The development process may be performed using a basic aqueous solution. An example of the basic aqueous solution development solution is a tetramethyl ammonium hydroxide (TMAH) aqueous solution. When the exposure light source is an ArF excimer laser, an 80 to 100 nm of line-and-space pattern may be obtained using a dose of 5 to 30 mJ/cm$^2$.

According to the development process, the resist layer and the resist underlayer are selectively removed, and thus a portion of the material layer may be exposed.

Subsequently, an etching process may be performed. Through the etching process, the exposed material layer may be etched to thereby form a pattern. The etching process may be performed using an etching gas. Examples of the etching gas include plasma of a halogen gas, or plasma of a fluorocarbon gas, e.g., $CHF_3$ and $CF_4$. Subsequently, the resist layer and the resist underlayer remaining on the substrate may be removed using a stripper to thereby form a desired pattern.

Through the process, a semiconductor integrated circuit device may be provided.

The composition and lithographic structure prepared according to an embodiment may be used for manufacturing and designing an integrated circuit device according to a semiconductor manufacturing process. For example, the composition and lithographic structure prepared according to an embodiment may be used for forming patterned material layer structures, such as a metal line, a hole for contact or bias, an insulation section, e.g., a damascene trench (DT) or shallow trench isolation (STI) structure, and a trench for a capacitor structure. Also, it is understood to those skilled in the art that the concept and scope of the present invention are not limited to a specific lithographic method or device structure.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis Example 1

350.4 g (1.0 mol) of 9,9'-bisphenolfluorene, 191.1 g (1.0 mol) of phenyl methyl dichlorosilane, and 202.4 g (2.0 mol) of triethylamine were dissolved in 3,500 g of toluene in a reactor using a mechanical agitator, a cooler, and a 10 L flask. The solution was agitated with the agitator. Ten hours later at 60° C., the reaction was complete.

Then, triethylamine hydrochloride was removed with water. The toluene solvent was distilled off under reduced pressure, obtaining a polymer represented by the following Chemical Formula 2 (Mw=4,300, polydispersity=1.6, and n=8).

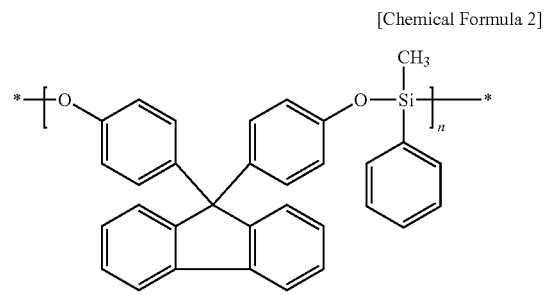

Synthesis Example 2

350.4 g (1.0 mol) of 9,9'-bisphenolfluorene, 253.2 g (1.0 mol) of diphenyl dichlorosilane, and 202.4 g (2.0 mol) of triethylamine were dissolved in 3,500 g of toluene in a reactor using a mechanical agitator, a cooler, and a 10 L flask. The solution was agitated with the agitator. Ten hours later at 60° C., the reaction was complete.

Then, triethylamine hydrochloride was removed using water. The toluene solvent was distilled off under reduced pressure, obtaining a polymer represented by the following Chemical Formula 3 (Mw=3,600, polydispersity=1.4, and n=6).

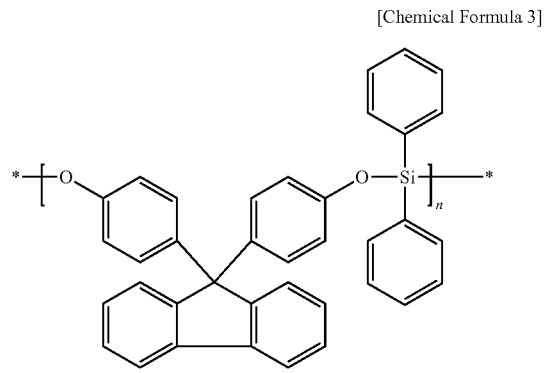

Synthesis Example 3

450.5 g (1.0 mol) of 9,9-bis(1-naphthol)fluorene, 129.1 g (1.0 mol) of dimethyl dichlorosilane, and 202.4 g (2.0 mol) of triethylamine were dissolved in 4,000 g of toluene in a reactor using a mechanical agitator, a cooler, and a 10 L flask. The solution was agitated with the agitator. Twelve hours later at 60° C., the reaction was complete.

Then, triethylamine hydrochloride was removed using water. The toluene solvent was distilled off under reduced pressure, obtaining a polymer represented by the following Chemical Formula 4 (Mw=5,700, polydispersity=1.7, and n=10).

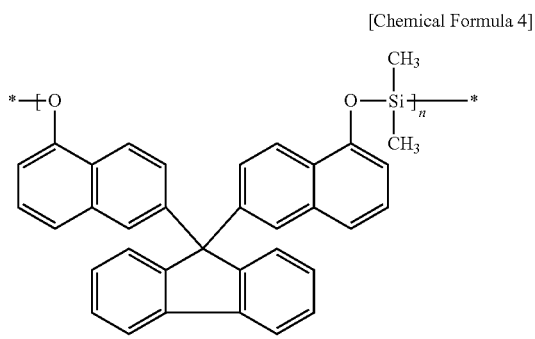

Synthesis Example 4

450.5 g (1.0 mol) of 9,9-bis(1-naphthol)fluorene, 253.2 g (1.0 mol) of diphenyl dichlorosilane, and 202.4 g (2.0 mol) of triethylamine were dissolved in 4,000 g of toluene in a reactor using a mechanical agitator, a cooler, and a 10 L flask. The solution was agitated with the agitator. Twelve hours later at 60° C., the reaction was complete.

Then, triethylamine hydrochloride was removed using water. The toluene solvent was distilled off under reduced pressure, obtaining a polymer represented by the following Chemical Formula 5 (Mw=5,600, polydispersity=1.4, and n=8).

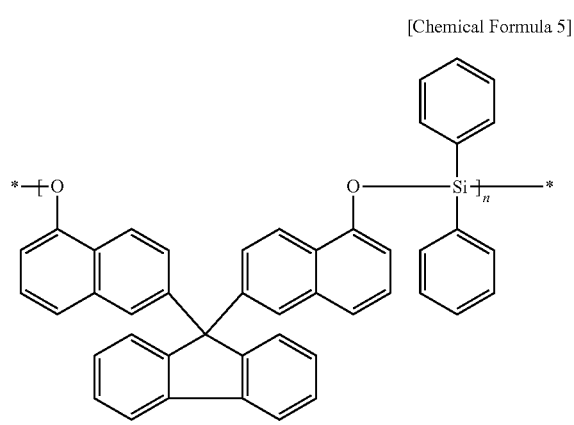

Synthesis Example 5

450.5 g (1.0 mol) of 99-bis(1-naphthol)fluorene, 283.4 g (1.0 mol) of dichloro dodecyl methyl silane, and 202.4 g (2.0 mol) of triethylamine were dissolved in 4,000 g of toluene in a reactor using a mechanical agitator, a cooler, and a 10 L flask. The solution was agitated with the agitator. Twelve hours later at 60° C., the reaction was complete.

Then, triethylamine hydrochloride was removed using water The toluene solvent was distilled off under reduced pressure, obtaining a polymer represented by the following Chemical Formula 6 (Mw=5,200, polydispersity=1.5, and n=7).

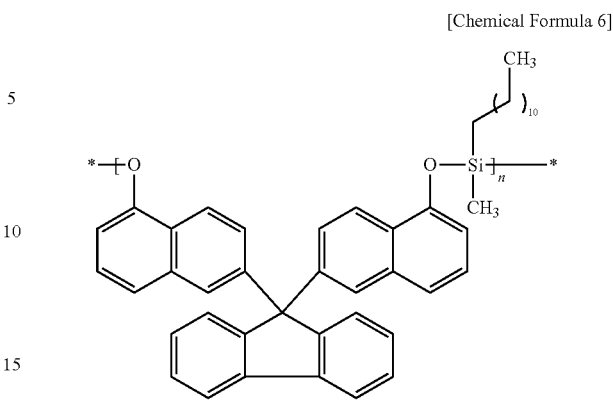

Examples 1 to 4

Respectively, 0.8 g of the polymers according to Synthesis Examples 1 to 4 were weighed and dissolved in 9 g of propylene glycol monomethylether acetate (hereinafter referred to be PGMEA). The solution was filtered, respectively preparing each resist underlayer composition of Examples 1, 2, 3, and 4.

The resist underlayer compositions according to Examples 1 to 4 were respectively coated on a silicon wafer in a spin-coating method and fired for 60 seconds at 400° C., forming a 2,500 Å-thick resist underlayer.

Each underlayer was measured regarding $n_{ri}$ as a refractive index and k as an absorbance. The measurement was performed using an ellipsometer (J. A. Woollam Co.). The results are provided in the following Table 1.

Comparative Example 1

A resist underlayer was formed according to the same method as Examples 1 to 4, except that a polymer of Synthesis Example 5 was used, instead of the polymers of Synthesis Examples 1 to 4. The underlayer was measured regarding $n_{ri}$ and k values. The results are provided in the following Table 1.

TABLE 1

| Polymer used for underlayer | Optical property (193 nm) | |
|---|---|---|
| | $n_{ri}$ (refractive index) | k (absorbance) |
| Example 1 | 1.41 | 0.40 |
| Example 2 | 1.39 | 0.66 |
| Example 3 | 1.33 | 0.38 |
| Example 4 | 1.42 | 0.61 |
| Comparative Example 1 | 1.43 | 0.73 |

As shown in Table 1, the compositions according to Examples 1 to 4 were identified to have a refractive index and an absorbance degree that can be used as an anti-reflection layer in an ArF (193 nm) wavelength.

Examples 5 to 8

The resist underlayer compositions according to Examples 1 to 4 were respectively coated in a SiN (silicon nitride) wafer in a spin-coating method and fired for 60 seconds at 400° C., forming a 2,500 Å-thick underlayer.

Next, an ArF photoresist was coated on the underlayer and fired at 110° C. for 60 seconds. After the firing process, the resulting product was exposed to light using ArF exposure equipment (ASML 1250 (FN70 5.0 active, NA 0.82)) and developed with tetramethyl ammonium hydroxide (an aqueous solution with a 2.38 wt % concentration). Then, an 80 nm line and space pattern thereof was examined using an FE (field emission)-SEM.

The EL (exposure latitude) margin depending on exposure changes was measured, and the DoF (depth of focus) margin depending on distance changes from a light was measured. The results are provided in the following Table 2.

Comparative Example 2

A patterned specimen was prepared according to the same method as Examples 5 to 8, except for using the resist underlayer composition of Comparative Example 1 instead of the resist underlayer compositions of Examples 1 to 4, and was respectively measured regarding EL, DoF, and pattern profile. The results are provided in the following Table 2.

TABLE 2

| Sample used for underlayer | Pattern properties | | |
|---|---|---|---|
| | EL margin ($\Delta$mJ/ exposure energy mJ) | DoF margin ($\mu$m) | Profile |
| Example 5 | 4 | 0.25 | cubic |
| Example 6 | 4 | 0.25 | cubic |
| Example 7 | 4 | 0.25 | cubic |
| Example 8 | 4 | 0.25 | cubic |
| Comparative Example 2 | 4 | 0.25 | cubic |

As shown in Table 2, the pattern evaluation results show that the examples and comparative examples had all good EL margin, DoF margin, and pattern profile with little difference therebetween.

Examples 9 to 12

The patterned specimens according to Examples 5 to 8 were used to dry-etch an underlayer using a $CHF_3$ and $CF_4$ mixed gas, and the silicon nitride was then dry-etched using a gas mixture of $CHF_3$ and $CF_4$ mixed in a different selective ratio.

Lastly, all the remaining organic materials were removed using oxygen ($O_2$) gas, and then the cross-sections were observed with the FE-SEM. The observation results are as shown in Table 3.

Comparative Example 3

An underlayer was etched according to the same method as Example 9 to 12, except for using the patterned specimen of Comparative Example 2, and the cross-section was then examined. The results are provided in the following Table 3.

TABLE 3

| | Pattern of underlayer after etching | Pattern of silicon nitride after etching |
|---|---|---|
| Example 9 | Vertical (Anisotropic) | Vertical (Anisotropic) |
| Example 10 | Vertical (Anisotropic) | Vertical (Anisotropic) |
| Example 11 | Vertical (Anisotropic) | Vertical (Anisotropic) |
| Example 12 | Vertical (Anisotropic) | Vertical (Anisotropic) |
| Comparative Example 3 | Bowing | Tapered |

As shown in Table 3, the underlayers of Examples 9 to 12, which were formed of the underlayer compositions of Examples 1 to 4, respectively had good patterns after the underlayer etching and the silicon nitride etching, and thus turned out to have sufficient resistance against an etching gas as a result of the etching evaluation. Accordingly, the silicon nitride etching was performed well.

On the other hand, the underlayer of Comparative Example 1 formed of the underlayer composition of Comparative Example 3 was identified to have bow-shaped isotropic etching after the underlayer etching. Thus, it was tapered during the silicon nitride etching.

As described above, a polymer for a resist underlayer according to an embodiment may provide excellent optical properties, mechanical characteristics, and etching selectivity characteristics. The resist underlayer composition including the polymer according to an embodiment may be coated using a spin-on application technique on a substrate, may be useful for a short wavelength lithographic process, and may not be contaminated by an acid catalyst because the acid catalyst may be used in a small amount.

The resist underlayer composition according to an embodiment may have a refractive index and an absorption appropriate for an antireflective layer in a DUV wavelength region such as ArF (193 nm). Thus, it may minimize reflectivity between the resist and the underlayer. Accordingly, the resist underlayer composition may provide an excellent lithographic structure in terms of pattern profile or margins. The resist underlayer composition may have high etching selectivity during a lithographic process and sufficient resistance against multiple etching, compared to the conventional composition. Thus, an etching profile of a resist underlayer (which is an image to be transferred to a lower layer) may be very good.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An aromatic ring-containing polymer for a resist underlayer, the polymer comprising:

a unit represented by the following Chemical Formula 1:

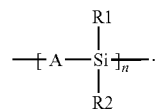

wherein,

R1 and R2 are independently hydrogen, a C1 to C10 alkyl group, or an aromatic group, A is a functional group derived from an aromatic compound represented by the following Chemical Formula 1b:

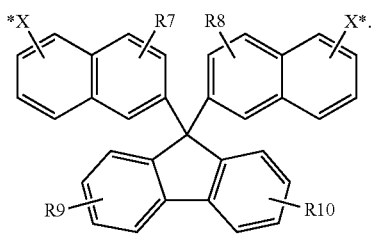

R7 and R8 are independently hydrogen, a hydroxy group, an alkoxy group, or a C1-C4 lower alkyl group, R9 and R10 are independently hydrogen, a hydroxy group, an alkoxy group, or a C1-C4 lower alkyl group, X is O (oxygen) or S (sulfur), and n is an integer of one or more.

2. The polymer as claimed in claim 1, wherein the aromatic group includes a C5 to C20 aromatic group.

3. The polymer as claimed in claim 1, wherein X is O.

4. The polymer as claimed in claim 1, wherein the polymer has a weight average molecular weight of about 2,000 to about 20,000.

5. The polymer as claimed in claim 1, wherein the n is an integer of 1 to 100.

6. A resist underlayer composition, comprising:
(a) an aromatic ring-containing polymer including a unit represented by the following Chemical Formula 1; and
(b) an organic solvent selected from the group of propylene glycol monomethylether acetate, propylene glycol monomethylether, cyclohexanone, ethyl lactate, γ-butyrolactone, and acetyl acetone,

[Chemical Formula 1]

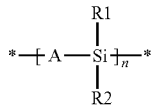

wherein, n is an integer of one or more,

R1 and R2 are independently hydrogen, a C1 to C10 alkyl group, or an aromatic group, A is a functional group derived from an aromatic compound represented by the following Formula 1b,

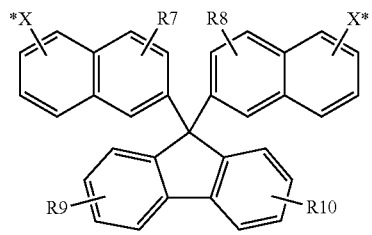

R7 and R8 are independently hydrogen, a hydroxy group, an alkoxy group, or a C1-C4 lower alkyl group, R9 and R10 are independently hydrogen, a hydroxy group, an alkoxy group, or a C1-C4 lower alkyl group, and X is O (oxygen) or S (sulfur).

7. The composition as claimed in claim 6, wherein the aromatic ring-containing polymer (a) is included in an amount of about 1 to about 20 wt %, and the organic solvent (b) is included in an amount of about 80 to about 99 wt %.

8. The composition as claimed in claim 6, further comprising a surfactant.

9. The composition as claimed in claim 6, further comprising a cross-linking component.

10. A method for patterning a device, the method comprising:
(a) providing a material layer on a substrate;
(b) forming a resist underlayer on the material layer using the resist underlayer composition as claimed in claim 6;
(c) forming a resist layer on the resist underlayer;
(d) exposing the resist layer on the substrate;
(e) developing the exposed substrate; and
(f) etching the developed substrate.

11. The method as claimed in claim 10, further comprising forming a silicon-containing resist underlayer prior to forming the resist layer.

12. The method as claimed in claim 11, further comprising forming a bottom antireflective coating (BARC) on the silicon-containing resist underlayer prior to forming the resist layer.

13. The method as claimed in claim 10, wherein the device is a semiconductor integrated circuit device.

14. A resist underlayer, comprising:
a cross-linked product of an aromatic ring-containing polymer, the aromatic ring-containing polymer including a unit represented by the following Chemical Formula 1:

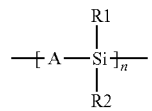

wherein, n is an integer of one or more,

R1 and R2 are independently hydrogen, a C1 to C10 alkyl group, or an aromatic group, A is a functional group derived from an aromatic compound represented by the following Chemical Formula 1b:

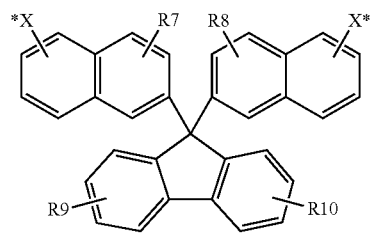

R7-R10 are independently hydrogen, a hydroxyl group, a C1-C4 lower alkyl group, or an alkoxy group, and X is O (oxygen) or S (sulfur).

* * * * *